US010896837B2

(12) United States Patent
Pilgrim

(10) Patent No.: US 10,896,837 B2
(45) Date of Patent: Jan. 19, 2021

(54) CERAMIC FOAM FOR HELIUM LIGHT-UP SUPPRESSION

(71) Applicant: Lam Research Corporation, Fremont, CA (US)

(72) Inventor: Gregory A. Pilgrim, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 204 days.

(21) Appl. No.: 16/149,076

(22) Filed: Oct. 1, 2018

(65) Prior Publication Data

US 2020/0105568 A1  Apr. 2, 2020

(51) Int. Cl.
*H01L 21/683* (2006.01)
*H01L 21/67* (2006.01)
*H01J 37/32* (2006.01)

(52) U.S. Cl.
CPC .... *H01L 21/6833* (2013.01); *H01L 21/67103* (2013.01); *H01J 37/3244* (2013.01); *H01J 37/32082* (2013.01); *H01J 37/32568* (2013.01); *H01J 37/32715* (2013.01)

(58) Field of Classification Search
CPC .......... H01L 21/6833; H01L 21/67103; H01L 21/67109; H01L 21/6831; H01L 21/68757; H01L 21/68785; H01J 37/32568; H01J 37/32082; H01J 37/3244; H01J 37/32715
See application file for complete search history.

(56) References Cited

U.S. PATENT DOCUMENTS

| | | | |
|---|---|---|---|
| 5,548,470 A * | 8/1996 | Husain | H01L 21/6833 |
| | | | 361/234 |
| 5,720,818 A | 2/1998 | Donde et al. | |
| 5,904,776 A | 5/1999 | Donde et al. | |
| 6,108,189 A | 8/2000 | Weldon et al. | |
| 6,414,824 B1 | 7/2002 | Sasaki | |
| 6,721,162 B2 | 4/2004 | Weldon et al. | |
| 9,627,240 B2 | 4/2017 | Yamaguchi et al. | |
| 9,905,449 B2 | 2/2018 | Yamaguchi et al. | |
| 9,960,067 B2 * | 5/2018 | Anada | H01L 21/6833 |
| 2002/0135969 A1 | 9/2002 | Weldon et al. | |
| 2004/0190215 A1 | 9/2004 | Weldon et al. | |

(Continued)

OTHER PUBLICATIONS

Notification of Transmittal of the International Search Report and the Written Opinion of the International Searching Authority, PCT/US2019/045812, dated Dec. 2, 2019, 12 pages.

*Primary Examiner* — Alex Torres-Rivera
(74) *Attorney, Agent, or Firm* — Penilia IP, APC

(57) ABSTRACT

A substrate support assembly for use in an electrostatic chuck (ESC) in a chamber of a semiconductor manufacturing apparatus is presented for eliminating thermal conductance gas light-up. In one embodiment, the substrate support assembly includes a dielectric block having an upper surface for interfacing with a substrate support surface and a lower surface configured for interfacing with a baseplate. The assembly further includes a plurality of plug channels for introducing gas through the dielectric block to a temperature conduction region between the substrate support surface and a lower surface of the substrate. Each of plug channels contains a ceramic foam plug having a body and a preformed pore matrix that is integrally distributed through the body for reducing the mean free path of the gas.

17 Claims, 11 Drawing Sheets

(56) References Cited

U.S. PATENT DOCUMENTS

| | | | |
|---|---|---|---|
| 2010/0109263 A1* | 5/2010 | Jun | H01L 21/67103 |
| | | | 279/128 |
| 2013/0209704 A1* | 8/2013 | Krueger | C23C 16/045 |
| | | | 427/569 |
| 2015/0279714 A1 | 10/2015 | Yamaguchi et al. | |
| 2016/0276198 A1 | 9/2016 | Anada et al. | |
| 2017/0110356 A1* | 4/2017 | Matyushkin | H01L 21/68785 |
| 2017/0178944 A1 | 6/2017 | Yamaguchi et al. | |
| 2017/0256431 A1* | 9/2017 | Parkhe | H01L 21/6875 |
| 2017/0352568 A1* | 12/2017 | Cho | H01J 37/32706 |
| 2018/0240688 A1* | 8/2018 | Hao | H01J 37/32477 |

* cited by examiner

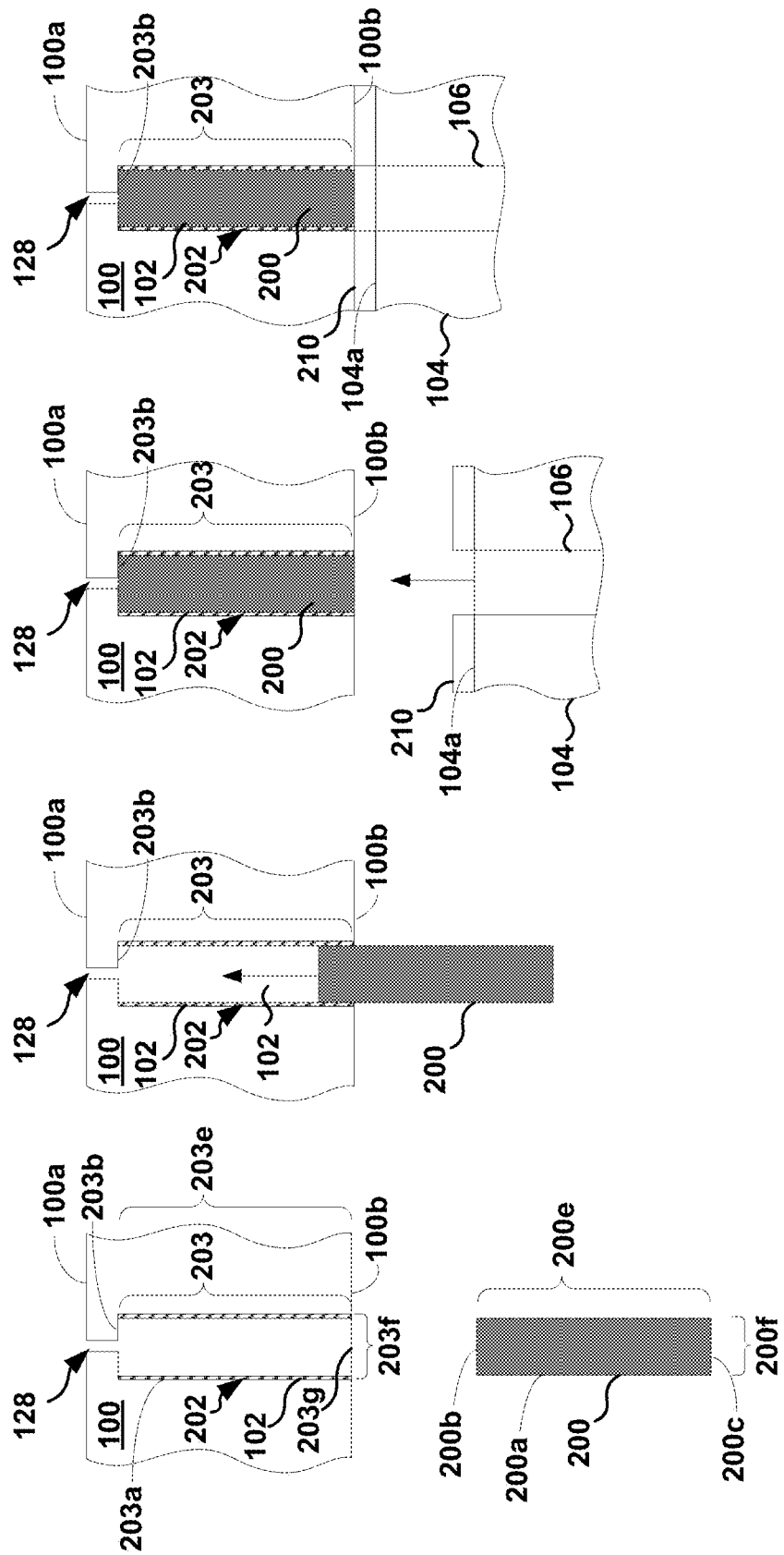

CERAMIC FOAM FOR HELIUM LIGHT-UP SUPPRESSION

BACKGROUND

1. Field of the Invention

The present disclosure relates to systems and methods for improving the design of an electrostatic chuck (ESC), and more particularly, for eliminating light-up of thermal conductance gas within the ESC.

2. Description of the Related Art

Some new semiconductor manufacturing processes utilize very high radio frequency (RF) power to generate plasma. The high RF power increases the RF currents and total voltages applied to the ESC, also referred to herein as chuck or wafer susceptor, when compared to previous solutions with lower RF power levels.

In addition, some new plasma etch processes require significantly lower RF frequencies (e.g., 2 MHz or lower) than previously utilized. The lower RF frequencies cause an increase in the RF voltage applied across the ESC ceramic. The high voltage applied across the ceramic may cause electrical discharge (i.e., arcing) between the wafer and the baseplate, and may cause ignition of the thermal conductance gas (e.g., He, or other chemistry) in the gas supplying holes. This phenomenon is also commonly referred to as gas light-up.

Arcing in the ESC may cause damage to the ESC and/or damage to other chamber components. Further, such arcing may in some cases cause interruption of the manufacturing process. Sometimes the destruction of the ESC is fast, catastrophic, and easily detected, but other times there is a gradual deterioration that may unknowingly affect multiple wafers, and the damage to the wafers may only be detectable at later steps of the manufacturing process.

It is in this context that embodiments arise.

SUMMARY

An ESC in a chamber of a semiconductor manufacturing apparatus is presented for eliminating cooling-gas light-up. One wafer support includes a baseplate connected to a radiofrequency power source, a dielectric block, gas supply channels for cooling the wafer bottom, and ceramic foam plugs inserted within gas delivery channels where gas light-up would otherwise occur. The dielectric block is situated above the baseplate and supports the wafer during operation of the chamber. As used herein, gas delivery channels may be referred to as plug channels for their ability to hold in place the ceramic foam plugs. The ceramic foam plugs are formed to have pores of such a range of sizes that reduce the mean free path of the thermal conductance gas while flowing through the gas delivery channel. In so doing, the ceramic foam plugs reduce the likelihood that any given gas molecule is able to be accelerated in any given direction by the electric field for a relatively long distance. As a result, the overall kinetic energy of the gas is reduced and so is the likelihood of light-up events.

As used herein, the mean free path of a gas is the average distance a molecule of the gas is allowed to travel before successive collisions. The mean free path of a gas is dependent on a number of factors, including the size of the molecule, the pressure of the gas, the temperature of the gas, and the geometry of the space the gas occupies, among others. Embodiments contemplated here are for reducing the mean free path of a given gas at a given temperature by changing geometric aspects of the volume the gas occupies. In particular, improvements described herein involve the introduction of a greater amount of surface area for a given volume by using materials such as ceramic foam. The increased surface area is provided by a pre-formed pore matrix of ceramic foam. As a result of the pore matrix of the ceramic foam, the gas molecules are caused to experience more collisions or redirections on average over the same traveled distance or over the same amount of time as gas molecules in a volume without the ceramic foam.

In some embodiments, the ceramic foam provides, on average, two or more collisions for every collision of a gas molecule within the volume without ceramic foam. For example, if a gas molecule in a volume devoid of filler material makes one collision on average in cumulative distance of 100 microns, the ceramic foam is configured to reduce the mean free path of the gas molecule such that it is redirected or made to collide two or more times in the same distance of 100 microns. In so doing, the mean free path is essentially decreased by a factor of about 2 or more. In other embodiments, the mean free path may be reduced by a factor of about 100 or more. For example, if the mean free path of a gas such as helium at a given pressure is 100 microns in a given volume with no filler material, the ceramic foam is contemplated to be able to reduce the mean free path to about 50 microns or even down to 100 nanometers, depending upon the average size of the pores of the ceramic foam.

In one embodiment, a substrate support assembly is provided. The assembly includes a dielectric block having an upper surface for interfacing with a substrate support surface and a lower surface configured for interfacing with a baseplate. The assembly also includes a plurality of plug channels extending from the lower surface of the dielectric block to the upper surface of the dielectric block and through holes in the substrate support surface disposed over the upper surface of the dielectric block. The plurality of plug channels is configured to introduce gas through the dielectric block to a temperature conduction region between the substrate support surface and a lower surface of the substrate when present. Each of the plug channels has a plug region for containing a corresponding ceramic foam plug, each of which has a body and a pre-formed pore matrix that is integrally distributed throughout the body.

In another embodiment, a method for assembling an electrostatic chuck (ESC) is provided. The method includes a providing a dielectric block having an upper surface for interfacing with a substrate support surface and a lower surface for interfacing with a baseplate. The dielectric block including a plurality of plug channels extending from the lower surface of the dielectric block to the upper surface of the dielectric block, each plug channel having a plug region. The method further includes inserting a ceramic foam plug into the plug region for each plug channel. The ceramic foam plug having a body and a pre-formed pore matrix that is integrally distributed throughout the body. The method provides further for mating the lower surface of the dielectric block with an upper surface of the baseplate while the plurality of plug channels of the dielectric block is aligned with a respective plurality of gas distribution channels of the baseplate such that when gas flow out of the plurality of gas distribution channels, the gas flows into the respective ceramic foam plugs as inserted into the plurality of plug channels.

In another embodiment, an electrostatic chuck (ESC) is provided. The ESC includes a substrate support surface with a plurality of minimum contact area (MCA) pads for supporting the substrate. The ESC also includes a dielectric block having an upper surface that interfaces with the substrate support surface and a lower surface for interfacing with a baseplate. The dielectric block includes a plurality of plug channels extending from the lower surface of the dielectric block to the upper surface of the dielectric block and through holes in the substrate support surface. The plurality of plug channel is configured to introduce thermal conductance gas through the dielectric block to a temperature conduction region between the substrate support surface and a lower surface of the substrate when present. The ESC further includes a plurality of ceramic foam plugs inserted into the respected plug regions of the plurality of plug channels. Each ceramic foam plug has a body and a preformed pore matrix that is integrally distributed throughout the body. Further, the ESC includes a baseplate including a plurality of gas distribution channels for supplying thermal conductance gas into the plurality of ceramic foam plugs. The baseplate includes an upper surface that interfaces with the lower surface of the dielectric block such that the plurality of gas distribution channels are aligned with respective foam plugs of the dielectric block.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIGS. 3A-3G show a method of installing a ceramic foam plug into a gas delivery channel of a dielectric block, according to one embodiment.

DETAILED DESCRIPTION

Figures 1A, 1B:
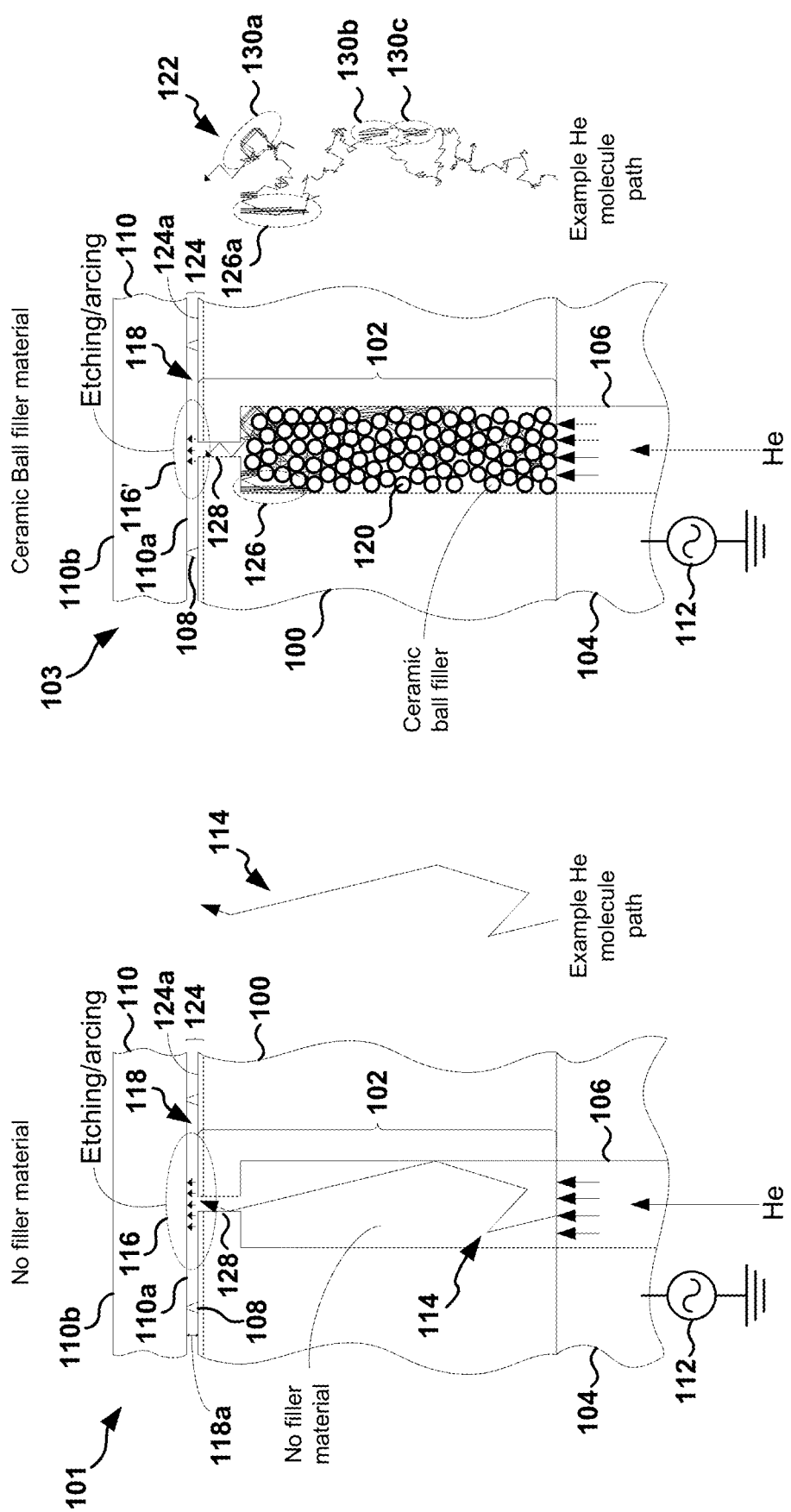
FIG. 1A shows a portion of a substrate support assembly of an electrostatic chuck (ESC) undergoing processing, according to one embodiment.
FIG. 1B shows a portion of a substrate support assembly of an ESC similar to that shown in FIG. 1A but with the gas delivery channel filled with a plurality of alumina balls, according to one embodiment.

The following embodiments describe systems, methods, and devices for eliminating thermal conductance gas light-up within an ESC. Embodiments presented described solutions for eliminating arcing in the ESC, and for solving the potential problem of gas (e.g., He) light-up, by forming and using ceramic foam plugs inside gas delivery channels where arcing and lighting-up have been found to occur within the ESC.

ESCs used in plasma reactors distribute helium (He) as a thermal transport material between the chuck surface and backside of a clamped wafer. Helium is distributed through delivery holes in a dielectric upper portion of the ESC. At high, or even modest bias voltages, helium gas in the delivery holes can break down (e.g., ionize) and become plasma. As a result, etching of the backside of the wafer may occur. In certain circumstances, arcing between the baseplate of the ESC and the wafer may also occur. Inadvertent etching of the backside of the wafer produces visible markings on the wafer, which is undesirable from a customer standpoint. Perhaps, more importantly, arcing can be more catastrophic and can damage or even destroy wafers and ESCs.

These occurrences, which are referred to herein as "light-up," are found to be suppressed by limiting the mean free path of gas molecules and their dissociated electrons at a given pressure. One way of doing so includes installing a filler material such as alumina balls into the helium delivery holes such that a given gaseous molecule cannot travel unimpeded for too far a distance before colliding with an alumina ball or with a wall of the delivery hole. However, it has also been observed that there is variability associated with packing of the alumina balls such that the spaces between the alumina balls are variable in size. For example, the spaces between alumina balls can be much larger than intended and can even become voids, thereby allowing a gaseous molecule to travel unimpeded beyond a desirable distance. As a result, it has been observed that gas light-up still occurs within the helium delivery holes even having been packed with alumina balls.

Additionally, there are variances associated with the sizes of the voids inside of the helium delivery holes, which, in turn, cause variances associated with frequency and magnitude of helium light-up between delivery holes and from ESC to ESC. While the use of alumina balls with smaller diameters may assist in reducing the presence of voids, the conductance of helium flowing through delivery holes having alumina balls with such diameters can be "choked-off" by their close packing. Maintaining an appropriate flow of helium at reasonable backing pressure is important for thermal uniformity during processing and for protecting helium holes from clogging. Therefore, an improved method or system is desirable for the suppression of helium light-up by eliminating voids within the filler material of the helium delivery holes while also maintaining high conductance of helium through the filler material. What is described here accomplishes both.

Ceramic foams can be created by a variety of methods. In many instances, ceramic foam is made of a ceramic such as alumina, zirconia, silicon carbide, among others. These ceramic foams can be made to have a high density of pores penetrating the bulk material. For example, ceramic foams can be made with porosity of up to 90% of overall volume, with individual pores being on the order of microns in size. Additionally, pore size can be tightly controlled during manufacturing. It is contemplated here that using ceramic foam with a combination of small but numerous pores as a filler material will result in improved light-up suppression while allowing appropriate levels of flow of thermal conductance gas. This is because the ceramic foam will limit the mean free path of helium and any excited electrons while maintaining high levels of helium flow due to the high overall volume of pores in any given volume of the ceramic foam.

It will be appreciated that while the improved systems and methods described here are with reference to helium as the thermal transport material, the advantages of the present disclosure will apply to many different other thermal transport materials. The reference to helium here is for illustrative purposes and is not intended to be limiting.

FIG. 1A shows a portion of a substrate support assembly of an ESC 101 undergoing processing, according to one embodiment. The ESC 101 includes a dielectric block 100 that interfaces with a baseplate 104. The dielectric block 100 may be formed from a ceramic material such as alumina, among others, and is nonconductive. The baseplate 104 is formed of a conductive material such as aluminum, although other conductive materials are possible. The baseplate 104 is connected to a radiofrequency (RF) power source 112 that provides power to the ESC 101. In other embodiments, the baseplate 104 may serve as ground. In still other embodiments, an RF grid (not shown) that is embedded into the dielectric block 100 may serve as ground (see FIG. 3E). A bonding layer between the dielectric block 100 and the baseplate 104 may be used to secure the two together. A substrate 110 is shown to sit on top of the ESC 101 by way of minimum contact area (MCA) pads 108 on a substrate support surface 124. The substrate 110 undergoes processing on the upper surface 110b.

The baseplate 104 is shown to include a gas distribution channel 106 that is in fluid connection with a gas supply. The gas distribution channel 106 is aligned with and distributes gas to gas delivery channel 102 of the dielectric block 100, which delivers the gas to a temperature conduction region 118 via a gas delivery hole 128. The temperature conduction region 118 is shown have a height 118a defined by the distance between a lower surface 110a of the substrate 110 and an upper surface 124a of the substrate support of the dielectric block 100. In some embodiments, the height 118a is between about 1 micron to about 1 mm, or between about 5 microns to about 100 microns, or about 10 microns.

During operation of the chamber, plasma is generated on top of the substrate 110 and exposure to the plasma may heat the substrate 110. To prevent the substrate 110 from becoming too hot, a thermal transport material such as helium is supplied to the temperature conduction region 118 via the gas distribution channel 106, the gas delivery channel 102, and the gas delivery hole 128. The gas that is delivered into the temperature conduction region 118 is typically of a lower temperature than the substrate 110. As a result, the thermal conductance gas absorbs heat from the substrate 110 through thermal conductance that occurs when the thermal conductance gas interacts molecularly with the lower surface 110a of the substrate 110.

During processing, thermal conductance gas within the gas distribution channel 106, the gas delivery channel 102, and the temperature conduction region 118 may become excited by magnetic induction and electric field potential. In some embodiments, the electric field component of the RF field contributes more to the linear acceleration of charged particles such as ions and electrons while the magnetic induction component of the RF field contributes more to the ionization of the gas (e.g., stripping electrons from the gas molecule). When the gas is ionized and accelerated, it becomes more excited and may result in plasma generation events and discharge events (e.g., arcing). For example, once accelerated to greater velocities, ionized gas molecules will collide with other gas molecules with greater energies, and as a result, generating more ionization events which promote plasma generation. Once generated, the plasma has been observed to result in etching and arcing 116 of the lower surface 110a of the substrate 110. Additionally, arcing events have been observed to occur between the baseplate 104 and the substrate 110.

One of the factors that contributes to the excitation of the thermal conductance gas is the mean free path of its molecules and electrons while being delivered. The mean free path describes the average distance traveled by a molecule of gas or an electron between successive collisions, either with other molecules or with a solid. When the mean free path of the thermal conductance gas is higher, ions of the gas are accelerated linearly to a greater extent in a given direction and are thus able to build up more kinetic energy. The increase in kinetic energy of the gas increases the energy of subsequent collisions gas molecules have with one another, which increases likelihood that those collisions events result in ionization events. The overall effect of the increased colliding energy may be the generation of plasma or arcing. The same is true of electrons, which are accelerated to even greater speeds than gas ions.

A schematic example He molecule path 114 is shown for illustrative purposes. The path 114 is not drawn to scale. However, it does serve to illustrate the relative mean free paths and collision density with reference to paths 122 and 204 shown in FIGS. 1B and 2, respectively. Since the pressure defined by the gas distribution channel 106, the gas delivery channel 102, and temperature conduction region 118 may be relatively low under vacuum conditions (e.g., 1 Torr to 100 Torr), the mean free path of the thermal conductance gas may be relatively large. For example, the mean free path of a He plasma ion at 40 Torr and at room temperature is on the order of tens of centimeters, which is a sufficient distance to accelerate ions and electrons to great velocities. The path 114 is shown to include relatively few collisions and longer distances between successive collisions, resulting in excitation and susceptibility to light-up.

It is thus contemplated that one way of suppressing light-up of the thermal conductance gas is to reduce the mean free path of that gas. When the mean free path of a molecule of thermal conductance gas is reduced while traveling through the ESC 101, it is not accelerated for very long in a given direction before successive collisions. As a result, the overall kinetic energy of the gas is kept lower, which reduces the likelihood of ionization events that contribute to gas light-up. The mean free path of gas is approximated by the following equation:

$$\lambda = \frac{RT}{\sqrt{2}\pi d^2 N_A P} \quad (1)$$

In Equation (1), R is the gas constant, T is the temperature, d is the nominal diameter of the gas molecule, $N_A$ is Avogadro's number, and P is pressure. In one sense, increasing pressure P would reduce the mean free path of the thermal conductance gas. However, doing so would increase the backside pressure on the lower surface 110a of the substrate 110 and could result in the substrate 110 unseating from the ESC 101. Further, even if increasing pressure decreases the mean free path of the thermal conductance gas, the resulting increase in its concentration may also increase the likelihood of ionization events or arcing events. As a result, a different way of reducing the mean free path of gas is contemplated, such as by altering the geometry of the space traveled by the gas.

FIG. 1B shows a portion of a substrate support assembly of an ESC 103 similar to the view in FIG. 1A but with the gas delivery channel 102 filled with a plurality of alumina balls 120, according to one embodiment. For the embodiment shown in FIG. 1B, the alumina balls are approximately 200 microns in diameter. The alumina balls 120 change the geometry of the space inside the gas delivery channel 102 and effectively reduces the mean free path of the thermal conductance gas travelling through the gas delivery channel 102. It is estimated that by packing the gas delivery channel 102 with alumina balls of 200 micron diameter results in average void spaces of 200 microns. Similarly, it is estimated that the mean free path gas flowing through the gas delivery channel 102 with alumina balls 120 is on the order of hundreds of microns. As a result, while light-up events may be reduced, they are not reduced significantly because a space of a hundred microns is still enough of a distance to accelerate charged particles to great speeds.

An example He molecule path 122 is shown to result from filling the gas delivery channel 102 with the alumina balls 120. The path 122 shows greater number of collisions due to the presence of the alumina balls 120, and, as a result, fewer uninterrupted stretches of travel (e.g., distances between successive collisions). However, even with the alumina balls 120 placed inside the gas delivery channel 102, light-up events have been observed to occur, such as etching and arcing 116'. It is contemplated that the light-up events are caused by voids within the gas delivery channel 102 despite the presence of the alumina balls 120. For example, void 126 is shown to be formed by the absence of alumina balls 120 near the top end of the gas delivery channel 102 and allows for an uninterrupted stretch of travel.

The path 122 shows regions 126a, 130a, 130b, and 130c that have uninterrupted stretches of travel (e.g., linear distances without an intervening collision). The regions 126a, 130a, 130b, and 130c therefore enable ions and electrons to be accelerated to great enough speeds to induce ionization cascades, which increase the likelihood of light-up events such as etching and arcing 116. An improved method or system is therefore contemplated for reducing the mean free path of the thermal conductance gas while reducing the presence of voids within gas delivery channels 102.

Figure 2:
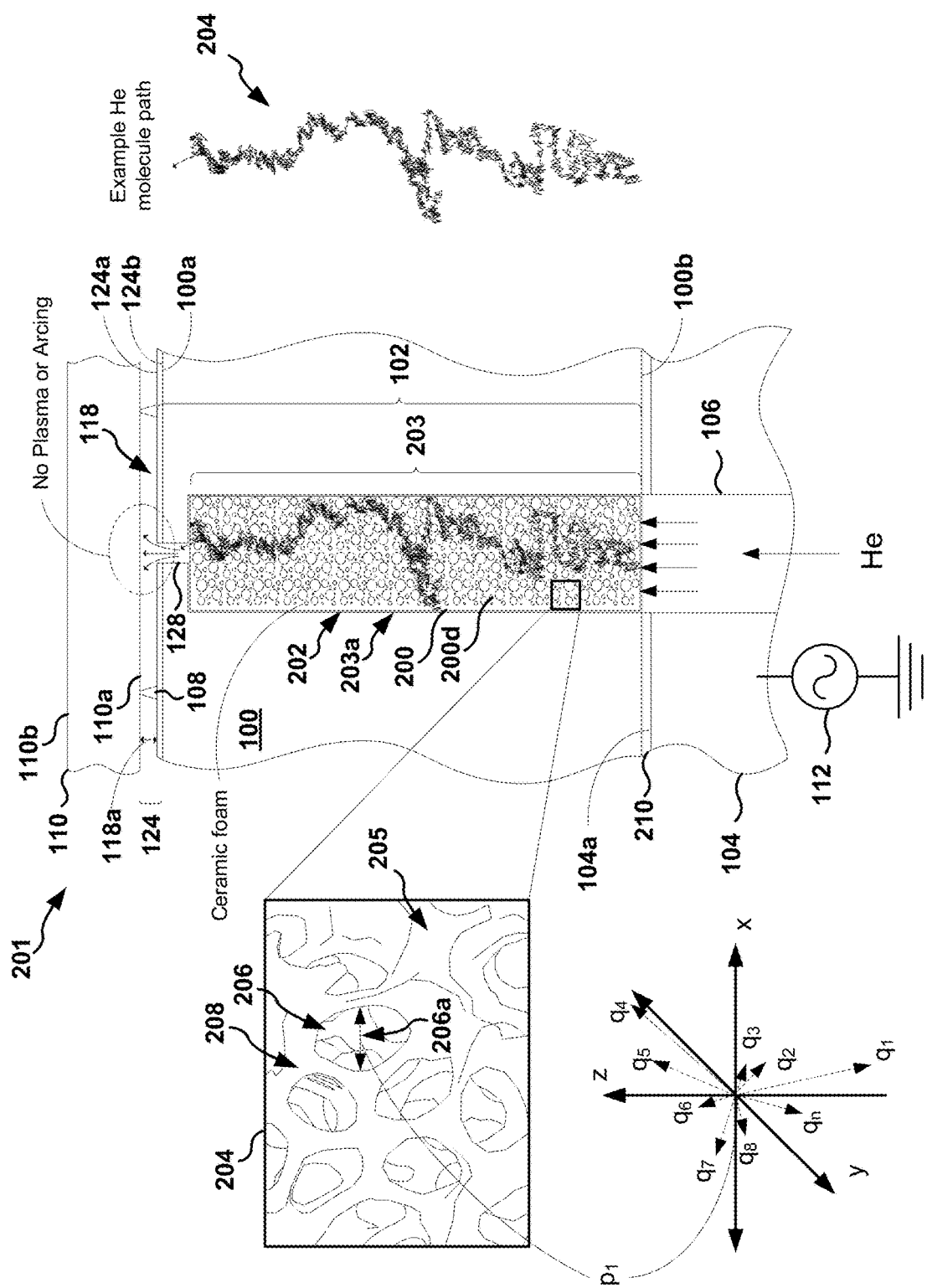
FIG. 2 shows a view of a substrate support assembly of an ESC having a ceramic foam plug that fills a portion of the gas delivery channel, according to one embodiment

FIG. 2 shows a view of an upper portion of a substrate support assembly of an ESC 201 having a ceramic foam plug 200 that fills a plug region 203 of the gas delivery channel 102, according to one embodiment. The ceramic foam plug 200 may be preformed and installed into the dielectric block 100 during assembly of the ESC 201, or it may be formed (e.g., fired) at the same time that the dielectric block 100 is formed. In other embodiments, ceramic slurry may be injected into the plug region 203 along with an initiator, catalyst, and organic monomers. The ceramic slurry may contain ceramic particles, water, and dispersant. The ceramic slurry is then made to produce foam using a foaming agent. After sufficient foaming, the organic monomers form polymers. A gas within the foam then presses against the polymers to form the pores of the resulting ceramic foam plug 200. Then, the foamed ceramic is sintered or "fired" to leave behind the pore matrix 205 of the ceramic foam plug 200 shown having a pore matrix that is integrally distributed throughout the body 200d of the ceramic foam plug 200.

The ESC 201 is shown to have a substrate support surface 124, including MCA pads 108 on which the substrate 110 sits. A lower surface 124b of the substrate support surface 124 interfaces with an upper surface 100a of the dielectric block 100. A temperature conduction region 118 is shown to exist between the lower surface 110a of the substrate 110 and an upper surface 124a of the substrate support surface 124. Additionally, a lower surface 100b of the dielectric block 100 interfaces with an upper surface 104a of the baseplate 104 by way of a bonding layer. The baseplate 104 may be powered by RF power source 112, or it may be grounded. In other embodiments, an RF grid is embedded into the dielectric block 100 and serves as ground.

In FIG. 2, the ceramic foam plug 200 is bonded to the vertical walls 203a of plug region 203 of the gas delivery channel 102 with a bonding layer 202. The bonding layer 202 may be of any suitable bonding material. In some embodiments, the bonding layer 202 may be between about 0.01 mm to about 2 mm thick, or between about 0.1 mm to about 1 mm thick, or between about 0.2 mm to about 0.5 mm thick. In some embodiments, the bonding layer 202 may be of an epoxy or polymer material that maintains integrity through hundreds or thousands of process cycles, or at least for the life of the ESC 101.

The ceramic foam plug 200 has numerous openings, "cells," or pores that enable gas to flow through but that also limit the mean free path of the gas while flowing. A magnified view 214 of a region of the ceramic foam plug 200 is shown for illustrative purposes to demonstrate how an embodiment a pre-formed pore matrix 205 may appear. A pore 206 is pointed out to show the space that the gas may flow through. The pore 206 is an opening or void within ceramic material 208 that interconnects throughout a body 200d of the ceramic foam plug 200. The pore 206 is associated with a diameter 206a that approximates the size of the pore 206. Because pores 206 are likely to not be circular or spherical in shape, the diameter 206a may be representative of an average diameter of the pore 206 for the entire shape of the pore 206. In this way, the average diameter is a measure of the average of the average diameter 206a for each discrete pore 206 across all of the pores. For a given ceramic foam plug 200, there may be anywhere between about $10^3$ about $10^9$, or between about $10^4$ to about $10^7$ or between about $10^4$ to about $1 \cdot 10^6$ individual pores disposed within the pore matrix 205 of the body 200d. The precise number of pores 206 will depend upon the size of the plug region 203, the desired porosity, the desired mean free path, the desired pressure, the species of thermal conductance gas, the intensity of the RF field, among other considerations. In any case, the pores are contemplated to be integrally distributed throughout the body 200d of the ceramic foam plug 200 such that there is uniformity in placement of the pore throughout the body 200d.

In another sense, the average diameter may be a measure of the average distance a point within void space is to the closest wall in every direction, averaged across every point within the void space. For example, assume $p_1$ is a point in void space within the body 200d of the ceramic foam plug 200. If rays $q_1, q_2, \ldots, q_n$ are drawn from point $p_1$ to the nearest wall in every direction, the average $\bar{q}$ of these rays is the average distance between point $p_1$ any surface that is closest to point $p_1$. The average, $\bar{r}$, of $\bar{q}$ for every point in void space of the ceramic foam plug 200, $p_1, p_2, \ldots, p_m$, is the average distance separating each point in void space from a nearest surface. Thus, the average $\bar{r}$, or $2*\bar{r}$, may also be used as a measure of the "pore size" or "average diameter" of the pores of the ceramic foam plug 200. Other measures of pore sizes and diameters may also be used to describe the space within the pore matrix.

In some embodiments, the pore sizes may be of greater uniformity throughout the ceramic foam plug 200, while in other embodiments, there may be greater variation in pore size. However, it is envisioned that the ceramic foam plug 200 is to be of such uniformity that large voids (e.g., larger than about 200 microns, or larger than 50 microns, or larger than 10 microns) do not form in the ceramic foam plug 200. Further, it is contemplated that the pore sizes are to be small enough to limit the mean free path of the gas while being large enough to enable a suitable flow of gas through the medium. In some embodiments, the pores of the ceramic foam plug 200 are contemplated to have diameters ranging from between about 100 nm to about 1 mm, or between about 1 micron to about 500 microns, or between about 10 microns to about 100 microns.

In addition to the size of the pores, the ceramic foam plug 200 is contemplated to have a porosity of between about 20% to about 99%, or between about 50% to about 95%, or between about 60% to about 80%. Porosity is a measure of void spaces in a material defined by the fraction of the volume of void (e.g., pores, openings, channels, crevices) divided by the total volume of the material (e.g., body 200d of the ceramic foam plug 200). The porosity of the ceramic foam plug 200 is contemplated to be within such a range so that the ceramic foam plug 200 does not "choke off" or restrict the flow too much, while also having sufficient solid material to limit the mean free path of the gas.

An example helium molecule path 204 is shown to result from flowing helium through the ceramic foam plug 200. The path 204 shows numerous collisions with the ceramic material of the ceramic foam plug 200 and also shows how the mean free path of the helium is reduced as compared to path 114. For example, the average of all of the linear distances of travel in path 204 may be smaller than that of path 114 by a factor of 10-50. Additionally, path 204 shows that the ceramic foam plug 200 does not allow uninterrupted stretches of movements for helium or electrons, as was seen in path 122 or path 114 (e.g., regions 126a, 130a, 130b, and 130c). As a result, the gas flowing through the ceramic foam plug 200 is prevented from becoming excessively accelerated and excited. The overall effect of such is suppression of gas light-up.

FIGS. 3A-3D show a method of installing a ceramic foam plug 200 into a plug region 203 of gas delivery channel 102 of a dielectric block 100, according to one embodiment. FIG. 3A shows a portion of a dielectric block 100 and a preformed ceramic foam plug 200 in preparation for installation. The dielectric block 100 includes a gas delivery channel 102 having a plug region 203 and a gas delivery hole 128. The plug region 203 includes vertical walls 203a and an upper horizontal wall 203b. A bonding layer 202 is shown to have been applied to the vertical walls 203a of the plug region 203. In some embodiments, the bonding layer 202 may also be applied to the upper horizontal wall 203b of the plug region 203. The gas delivery channel 102 may also be referred to as a plug channel for purposes of description for its use in containing the ceramic foam plug 200.

Although the bonding layer 202 is shown to have been applied to the vertical walls 203a and/or the upper horizontal wall 203b of the plug region 203 for purpose of securing the ceramic foam plug 200 to the gas delivery channel 102, other embodiments are also possible. For example, the bonding layer 202 may be applied to the upper surface 200b or the vertical surface 200a of the ceramic foam plug 200, or to both of surfaces 203a and 203b of the plug region 203, and surfaces 200a and 200b of the ceramic foam plug 200. The bonding layer 202 may be implemented with an epoxy or polymer material to secure the ceramic foam plug 200 to the plug region 203 such that the bonding layer 202 does not degrade over thousands of cycles of processing steps.

In FIG. 3B, the ceramic foam plug 200 is shown to be inserted into the plug region 203 of the gas delivery channel 102 until, as shown in FIG. 3C, it no longer protrudes out of the lower surface 100b of the dielectric block 100. As such, the ceramic foam plug 200 is contemplated to be mechanically inserted until the upper surface 200b interfaces with the upper horizontal wall 203b of the plug region 203. Additionally, in some embodiments, the ceramic foam plug 200 is contemplated to be shaped to a height 200e that matches substantially a height 203e of the plug region 203 such that when the ceramic foam plug 200 is inserted fully into the plug region 203, a lower surface 200c of the ceramic foam plug 200 is substantially flush with the lower surface 100b of the dielectric block 100. However, it may also be the case that the height 200e of the ceramic foam plug 200 is greater or smaller than the height 203e of the plug region 203 such that the lower surface 200c of the ceramic foam plug 200 protrudes from or is recessed from the lower surface 100b of the dielectric block 100, respectively.

Moreover, a width 200f of the ceramic foam plug 200 is contemplated to be smaller than the width 203f of the opening 203g of the plug region 203 such that the ceramic foam plug 200 may fit within the plug region 203 while also allowing space for the bonding layer 202. As such, the width 200f may be smaller than width 203f of the opening 203g by between about 100 nm to about 1 mm, or between about 1 micron to about 100 microns, depending upon various applications such as the thickness of the bond layer 202 desired. Generally, the cross section of the ceramic foam plug 200 may be of various shapes, including circular, oblong, triangular, rectangular, pentagonal, hexagonal, heptagonal, octagonal, and so on. In other embodiments, the cross section of the ceramic foam plug 200 may vary in shape and area across a height 200e or length of the ceramic foam plug 200. That is, for example, the ceramic foam plug 200 may be cylindrical, quasi-cylindrical, conical, pyramidal, and may also include tapered or beveled edges, flanges, cut-outs, etc., to fit the need of various shapes that the plug regions 203 may happen to take.

FIG. 3C also shows the dielectric block 100 and the baseplate 104 being mated together. As noted above, a bonding layer 210 material may be used to secure the dielectric block 100 to the baseplate 104. The bonding layer 210 material is shown to be applied to the upper surface 104a of the baseplate 104. The dielectric block 100 and the baseplate 104 are then pressed together while the gas distribution channel 106 is aligned with a respective gas delivery channel 102. The bonding layer 210 thus makes contact with the lower surface 100b of the dielectric block 100 and secures the dialectic block 100 to the baseplate 104. FIG. 3D shows the dielectric block 100 and the baseplate 104 having been mated together with the ceramic foam plug 200 held securely inside of the plug region 203 the gas delivery channel 102.

Figure 3F:
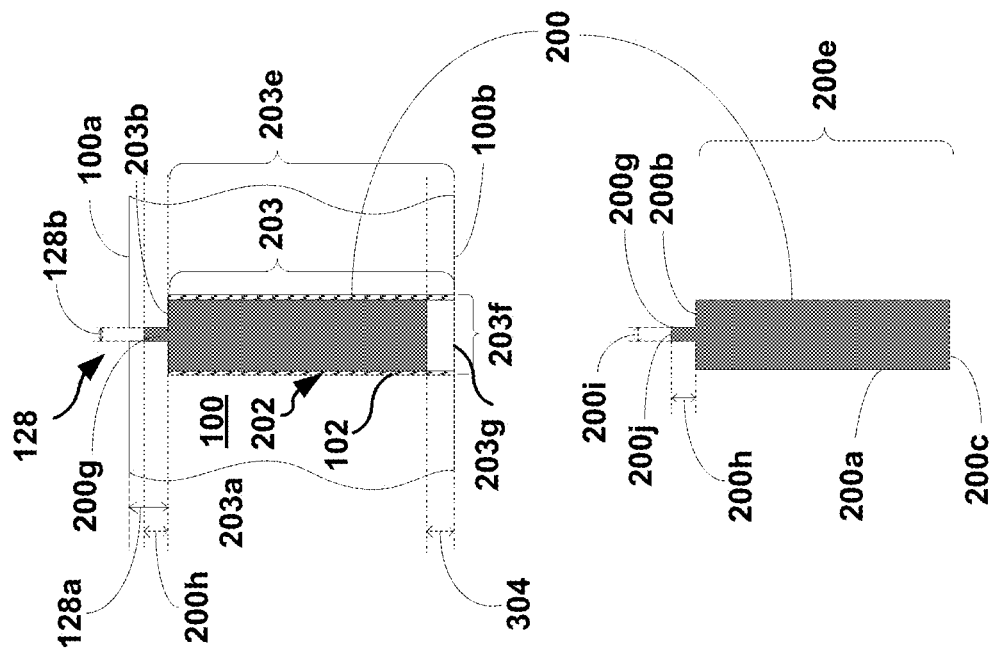
Figure 3E:
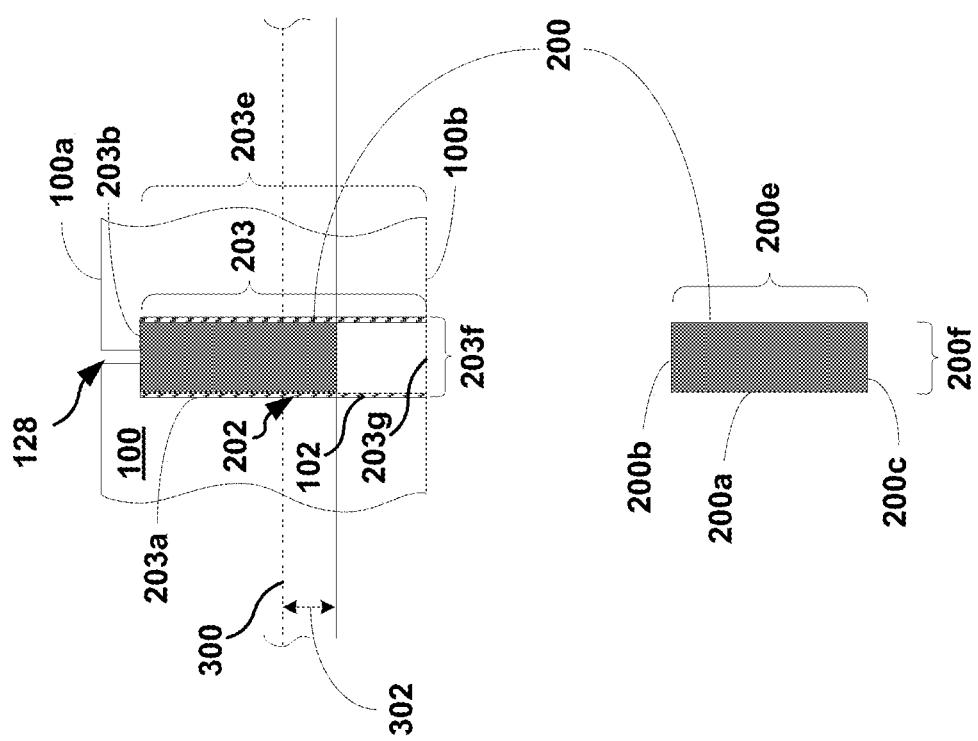

FIGS. 3E and 3F show additional embodiments of ceramic foam plugs 200 after having been installed in respective plug regions 203 of a gas delivery channel 102, using, for example, the method shown in FIGS. 3A-3C. FIG. 3E shows a ceramic foam plug 200 with a height 200e that is less than a height 203e of the plug region 203. In some embodiments, there is an RF grid 300 embedded in the dielectric block 100 that serves as ground. In these embodiments, radiofrequency waves pass through a substrate, through the temperature conduction region and may create capacitively-coupled-plasma within the gas delivery channel 102 before it hits the RF grid 300. The ceramic foam plug 200 is thus contemplated to extend to at least where the RF grid 300 is disposed, if not a distance 302 below it. Because the RF grid 300 does not extend into the space occupied by the gas delivery channels 102, the RF field may essentially travel past the RF grid 300 in the region of the gas delivery channel 102. Thus, it is contemplated that the distance 302 is to be on the order of millimeters to centimeters, depending upon the intensity of the field, the geometry of the RF grid 300, the geometry of the gas delivery channel 102, and the intensity of the field that dips into the gas delivery channel 102. In any case, FIG. 3E illustrates that the lower surface 200c of the ceramic foam plug 200 may be recessed from the lower surface 100b of the dielectric block 100.

FIG. 3E shows an embodiment of a ceramic foam plug 200 having a protrusion 200g that extends into the gas delivery hole 128, according to one embodiment. In certain embodiments, the RF field may excite gas as it travels from the plug region 203 to the gas delivery hole 128. Thus, it may be desirable to also have the ceramic foam plug 200 extend into the gas delivery hole 128 for at least some portion. In the embodiment shown, the ceramic foam plug 200 is shaped so as to have a protrusion 200g with a width 200i and shape (e.g., cross section) that corresponds to a shape and width 128b of the gas delivery hole 128. The protrusion 200g is shown to have a height 200h that extends into the gas delivery hole 128 that is less than the height 128a of the gas delivery hole 128. In other embodiments, however, the protrusion 200g may have a height 200h that substantially corresponds to the height 128a of the gas delivery hole 128. In this manner, an upper surface 200j of the protrusion 200g may be substantially flush with the upper surface of the dielectric block 100 or with the substrate support surface 124. In still other embodiments, the height 200h of the protrusion 200g may be slightly greater than the height 128a of the gas delivery hole 128, so long as it does not contact the substrate if not so desired.

Figure 3G:
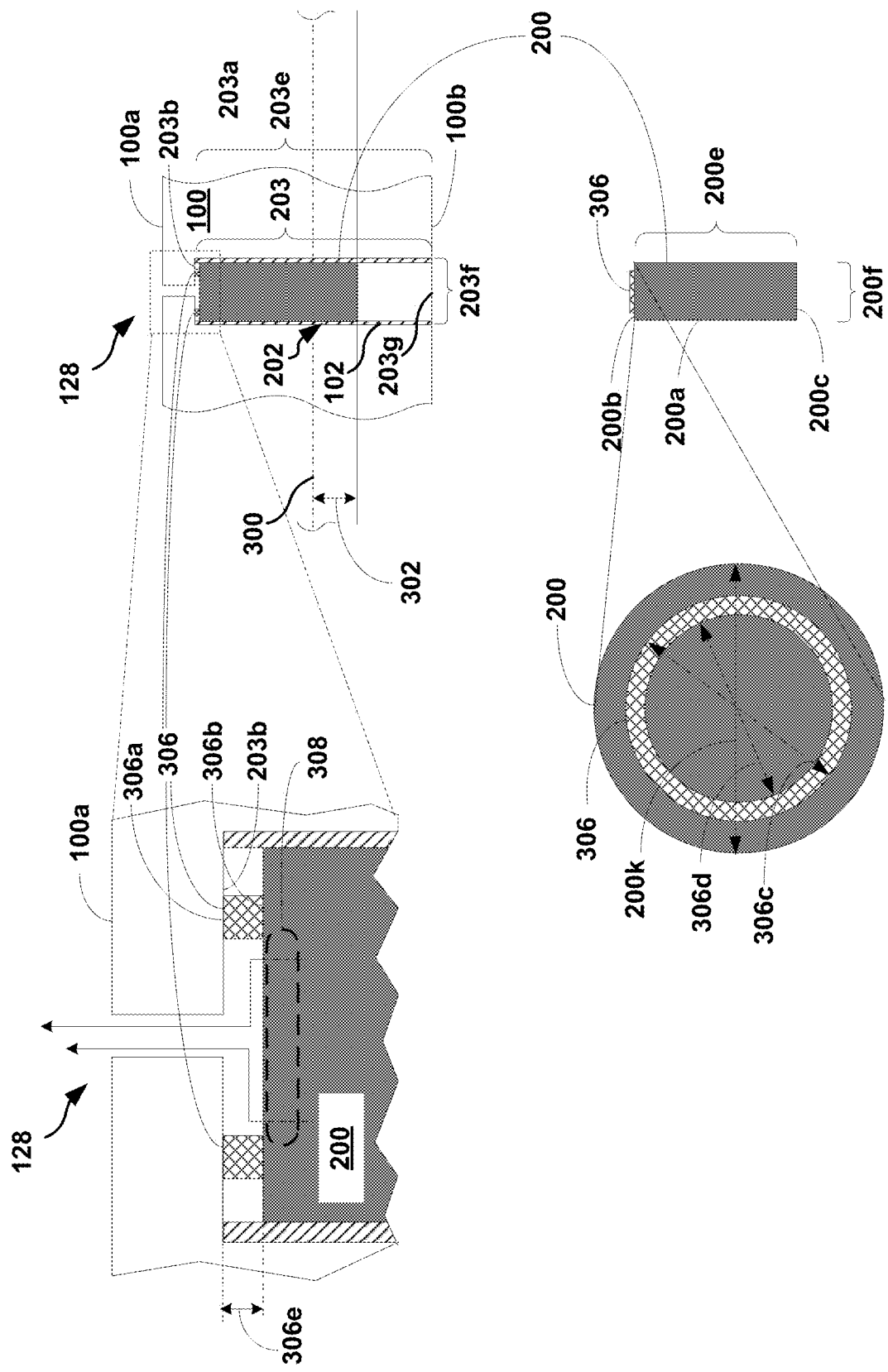

FIG. 3G shows an implementation of a plenum 306 along with a ceramic foam plug 200 to optimize thermal conductance gas flow through the gas delivery holes 128, according to one embodiment. The plenum 306 may be installed or embedded directly onto the upper surface 200b of the ceramic foam plug 200, or it may be mated to the upper horizontal wall 203b. In any case, the plenum 306 enables a greater number of pores to serve the gas delivery hole 128 (e.g., pores that are less favorable at directing molecules of thermal conductance gas into the gas delivery hole 128). For example, if a pore within the ceramic foam plug 200 is near the upper surface 200b at a location that is proximate to the upper horizontal wall 203b when the ceramic forma plug 200 is installed, it is likely that a large portion of the molecules traveling through that pore contact the upper horizontal wall 203b as opposed to traveling into the gas delivery hole 128. It is therefore contemplated that the plenum 306 can increase the number of pores that in a region 308 that contributes relatively directly to flow into the gas delivery hole 128.

The plenum 306 may be in the shape of ring, with an upper surface 306a that interfaces with the upper horizontal walls 203b of the plug region 203, and a lower surface 306b that contacts the upper surface 200b of the ceramic foam plug 200. The plenum 306 may have a height 306e that is between about 50 microns to about 2 millimeters, or between about 100 microns to about 1 millimeters, or between about 200 microns to about 500 microns. Additionally, the plenum 306 may have an outer diameter 306c that may correspond to an outer diameter 200k of the ceramic foam plug, or it may be smaller. The inner diameter 306d of the plenum 306 may be about 50 microns to about 1 millimeter smaller than the outer diameter 306c.

While the embodiments discussed in FIGS. 3A-3G show ceramic foam plugs 200 that are formed prior to insertion, other embodiments are contemplated. In one embodiment, the ceramic foam plug 200 is formed in situ. In this embodiment, a liquid ceramic foam precursor or a suspension having ceramic particles (e.g., a ceramic slurry) may be injected into the gas delivery channel 102, either through the gas delivery hole 128 or through the opening 203g. The liquid foam precursor or suspension is injected along with organic monomers, an initiator, and a catalyst to form a mixed slurry. The mixed slurry would then be caused to foam up using a foaming agent, which creates the void space that become pores. The pores are then stabilized by the polymerization of the organic monomers. The eventual polymer formation also shapes the ceramic material into the formation it will take after sintering. In this sense, the size of the pore can be tightly controlled based on the type of foaming agent used and the organic polymer used. In some embodiments, the size of the pockets formed by the polymer may be controlled down to the micron scale, and as a result, so can the size of the pores of the ceramic material. After the foaming and polymerization, the resulting foamed ceramic structure would then be sintered wherein portions of the liquid precursor, the organic polymer, the solvent, etc., would be vaporized away.

While the ceramic foam plugs 200 are shown in FIGS. 2, 3A-3G to be secured in the plug regions 203 by way of a bonding layer 210, other embodiments are contemplated. For example, as noted above, they can be formed in situ along with the dielectric block 100, and therefore do not require any additional material to secure the ceramic foam plug 200 to the dielectric block 100. In another embodiment, the ceramic foam plug 200 may be held in place by the baseplate 104 or by sleeve 706, or some other component that presses against the lower surface 100b of the dielectric block.

Figure 4:
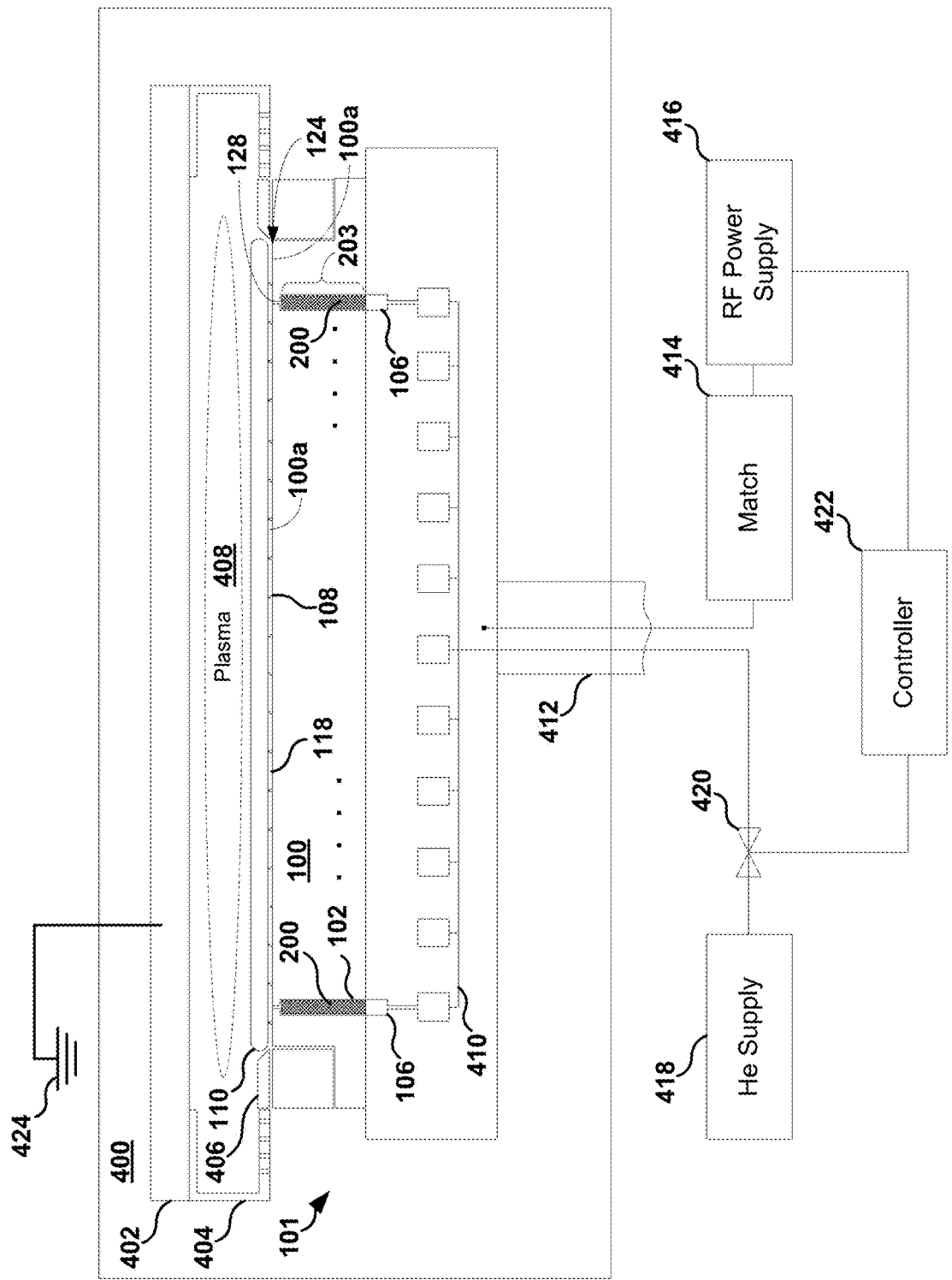
FIG. 4 shows a view of a plasma processing system that implements ceramic foam plugs for light-up suppression, according to one embodiment.

FIG. 4 shows a view of a plasma processing system 400 that implements ceramic foam plugs 200 for light-up suppression, according to one embodiment. The plasma processing system 400 is shown to include an ESC 101 with a dielectric block 100 a baseplate 104, which is situated on chuck 412. The ESC 101 is powered by the RF power supply 416 via match 414. Additionally, the ESC 101 is supplied with helium as a thermal conductance material by the He supply 418 via valve 420. Both the RF power supply 416 and the valve 420 are shown to be controlled by controller 422. The baseplate 104 is also shown to include a network of supply lines 410 that distribute the helium to the plurality of gas distribution channels 106.

The plasma processing system 400 also includes an upper electrode 402 that is grounded 424. In other embodiments, the baseplate 104 may be grounded while the upper electrode 402 may be powered by RF power supply 416. A shroud 404 extends from the upper electrode 402 to edge ring 406, which annularly surrounds the substrate 110. The shroud 404 assists in focusing the plasma 408 when it is present.

The substrate 110 is shown to sit on top of substrate support surface 124 of the ESC 101 that includes a plurality of minimum contact area (MCA) pads 108. In some embodiments, the substrate support surface 124 is formed from an additional layer that is applied to the dielectric block 100.

For example, in some embodiments, the substrate support surface 124 may be a film that covers the upper surface 100a of the dielectric block 100 having protrusions that serve as the MCA pads 108. In other embodiments, the substrate support surface 124 may be integral with the dielectric block 100 (e.g., the dielectric block 100 formed such that it serves as the substrate support surface 124). In any case, a temperature conduction region 118 is shown to exist between the lower surface 110a of the substrate 110 and the substrate support surface 124 such that gas flowing from the gas delivery channels 102 has space to diffuse and contact the substrate 110. In some embodiments, the gas may exit the temperature conduction region 118 through a space between the substrate 110 and edge ring 406. In other embodiments, the temperature conduction region 118 may be hermetically sealed such that the thermal conductance gas introduced into the temperature conduction region is pumped out via additional outlet lines within the upper surface 100a of the dielectric block 100, the baseplate 104 and the chuck 412. In some embodiments, the height of the MCA pads 108 as well as the temperature conduction region 118 is to be between about 1 micron to about 100 microns, or between about 5 microns to about 50 microns, or about 10 microns.

When thermal conductance material such as He is flowing through the ceramic foam plug 200 and into the temperature conduction region 118, the substrate 110 experiences some backside pressure. In some embodiments, the backside pressure is between about 0.1 Torr to about 100 Torr, or between about 1 Torr to about 50 Torr, or between about 15 Torr to about 40 Torr. Additionally, it is contemplated that a flow rate of the thermal conductance material collectively through the plurality of ceramic foam plugs 200 is to be about 0.1 L/min to about 1 L/min, or about 0.4 L/min to ensure appropriate amounts of thermal conduction to the substrate 110.

The power supplied by the RF power supply 416 is contemplated to be between about 0.1 kV to about 10 kV, or between about 2.5 kV to about 3 kV, although other ranges are possible. Additionally, the plasma processing system 400 is contemplated to operate at various temperatures, ranging from about −60° C. to about 800° C., or between about −40° C. to about 250° C. or at about 50° C.

Figure 5:
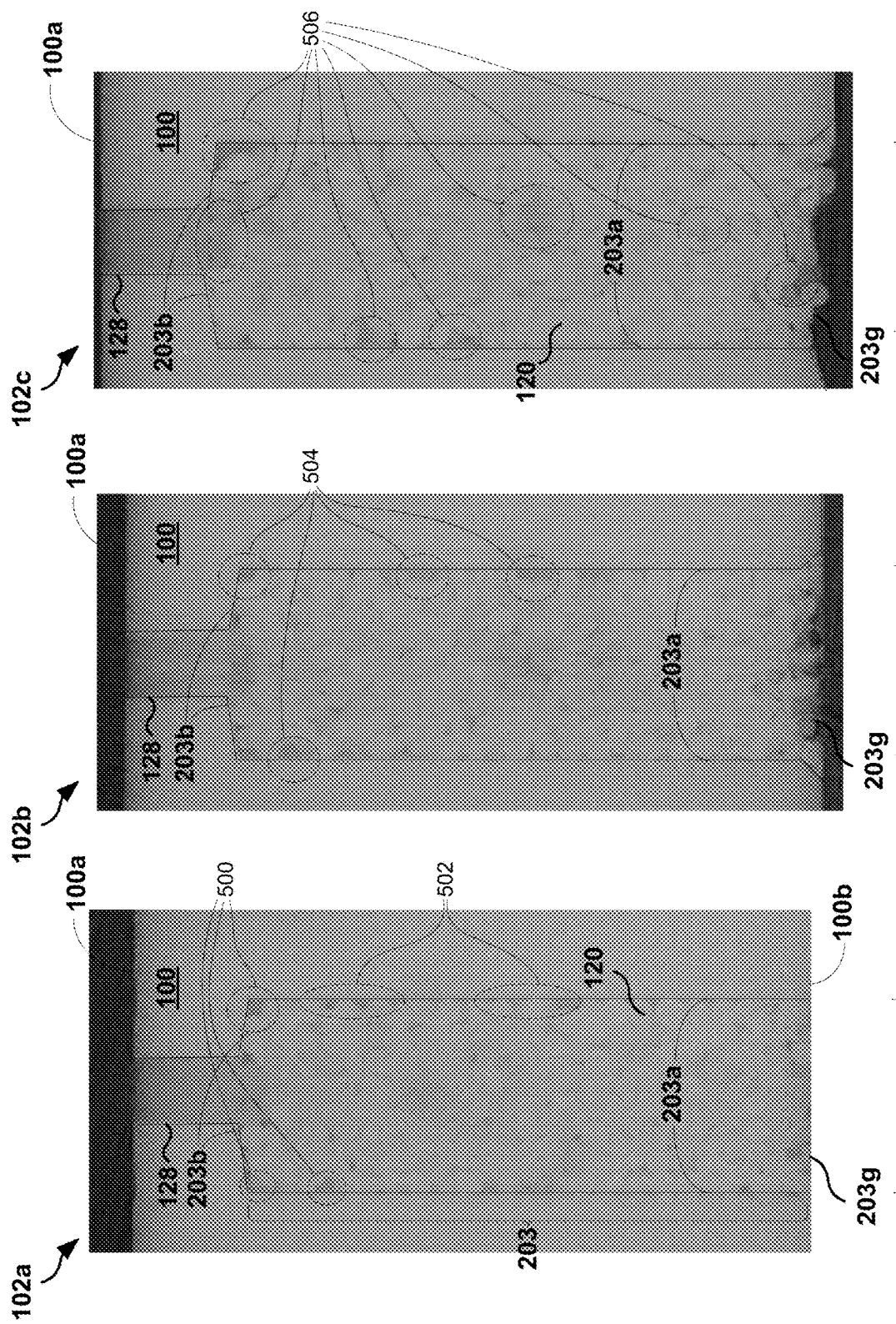
FIG. 5A-5C show cross-sectional images of different gas delivery channels packed with alumina balls to show the presence and variability of voids therein, according to certain embodiments.

FIGS. 5A-5C show cross-sectional images of different gas delivery channels 102a-102c packed with alumina balls 120 of approximately 200 micron diameters in the plug regions 203 to show the presence and variability of voids therein, according to certain embodiments. In the images of FIGS. 5A-5C, gas delivery channels 102a-102c have been cored out of the dielectric block 100 and filled with an epoxy material for potting the alumina balls 120 before being cross sectioned. Subsequently, optical images of the cross sections are taken.

FIG. 5A, for example, shows a well-packed gas delivery channel 102a that nevertheless exhibits a handful of voids 500, although of a smaller volume. It should be noted that voids 502 may exists in the gas delivery channels 102a, 102b, and 102c that, despite not being terribly wide, may extend for some length (e.g., up to order of millimeters). FIG. 5B shows another gas delivery channel 102b with a similar number and variety of voids 504 as that shown in FIG. 5A. FIG. 5C shows a third gas delivery channel 102c that is less well-packed. The voids 506 within gas delivery channel 102c shown in FIG. 5C are of greater number, size, and variability when compared to those of FIGS. 5A and 5B. Thus, FIGS. 5A-5C show how voids can develop in gas delivery channels 102a-102c even though they may seem fully packed with alumina balls 120. Moreover, there may be voids (e.g., along the walls of the gas delivery channels 102a-102c) that are not visible in the views provided by FIG. 5A-5C, but that are the result of each alumina ball 120 contacting the wall 203a at a single point. Thus, voids that are long but narrow are possible. The voids 500, 502, 504, and 506 shown in FIGS. 5A-5C enable gas molecules and electrons to be accelerated between successive collisions with another molecule or a solid. As a result, light-up events are prone to occur therein.

Figure 6:
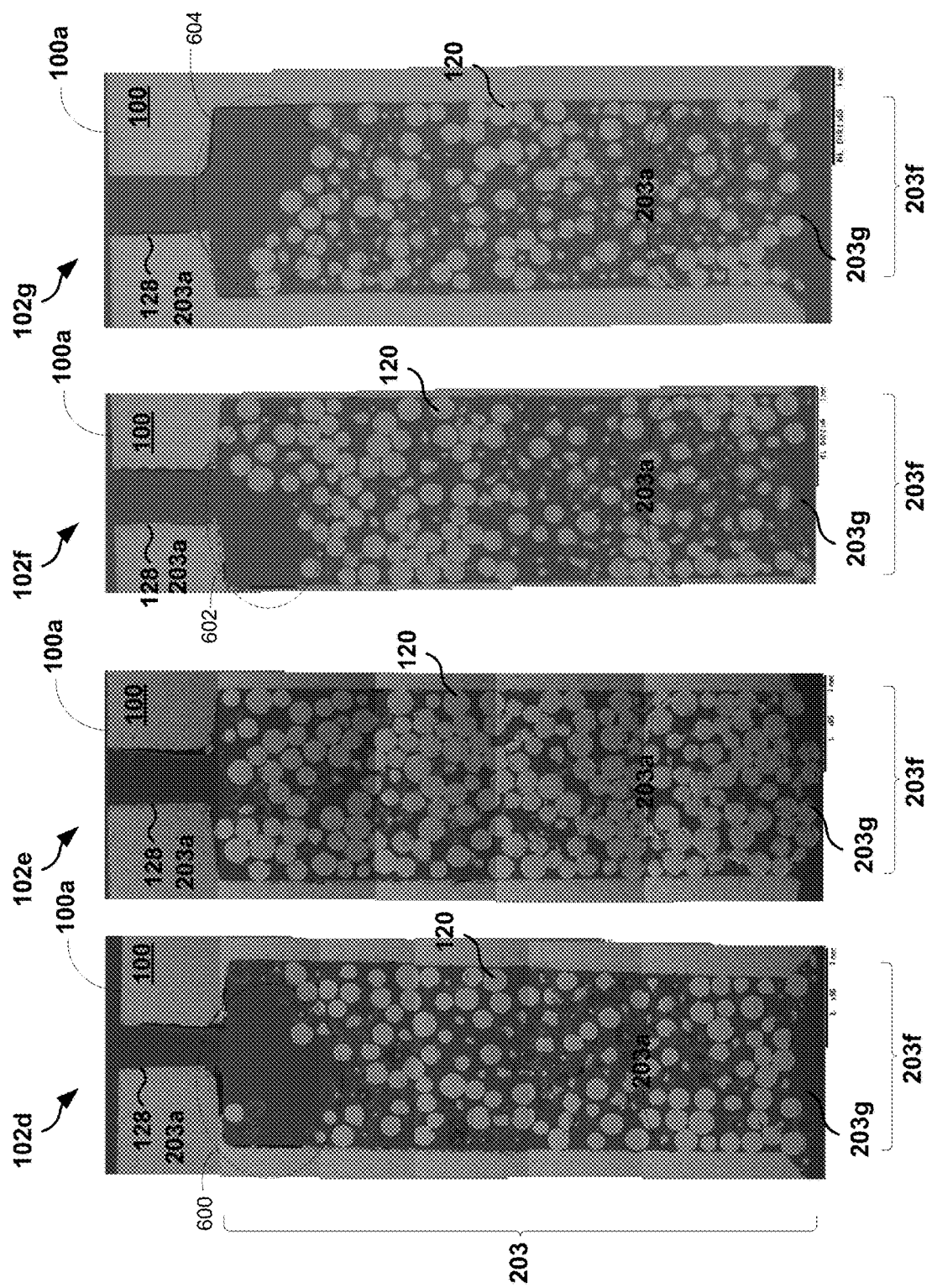
FIG. 6 shows views of several gas delivery channels having been packed with alumina balls, according to certain embodiments.

FIG. 6 shows views of several gas delivery channels 102a-102c having been packed with alumina balls 120 of approximately 200 micron diameters, according to certain embodiments. In the images of FIGS. 6A-6D, gas delivery channels 102d-102g have been cored out of the dielectric block 100 and filled with an epoxy material for potting the alumina balls 120 before being cross sectioned. Subsequently, scanning electron microscope (SEM) images of the cross sections are taken. The voids 600-604 shown in the dash-lined circles may form towards the top of the gas delivery channels 102d-102g due to gravity causing the alumina balls 120 to settle toward the bottom of the gas delivery channels 102d-102g.

Figure 7:
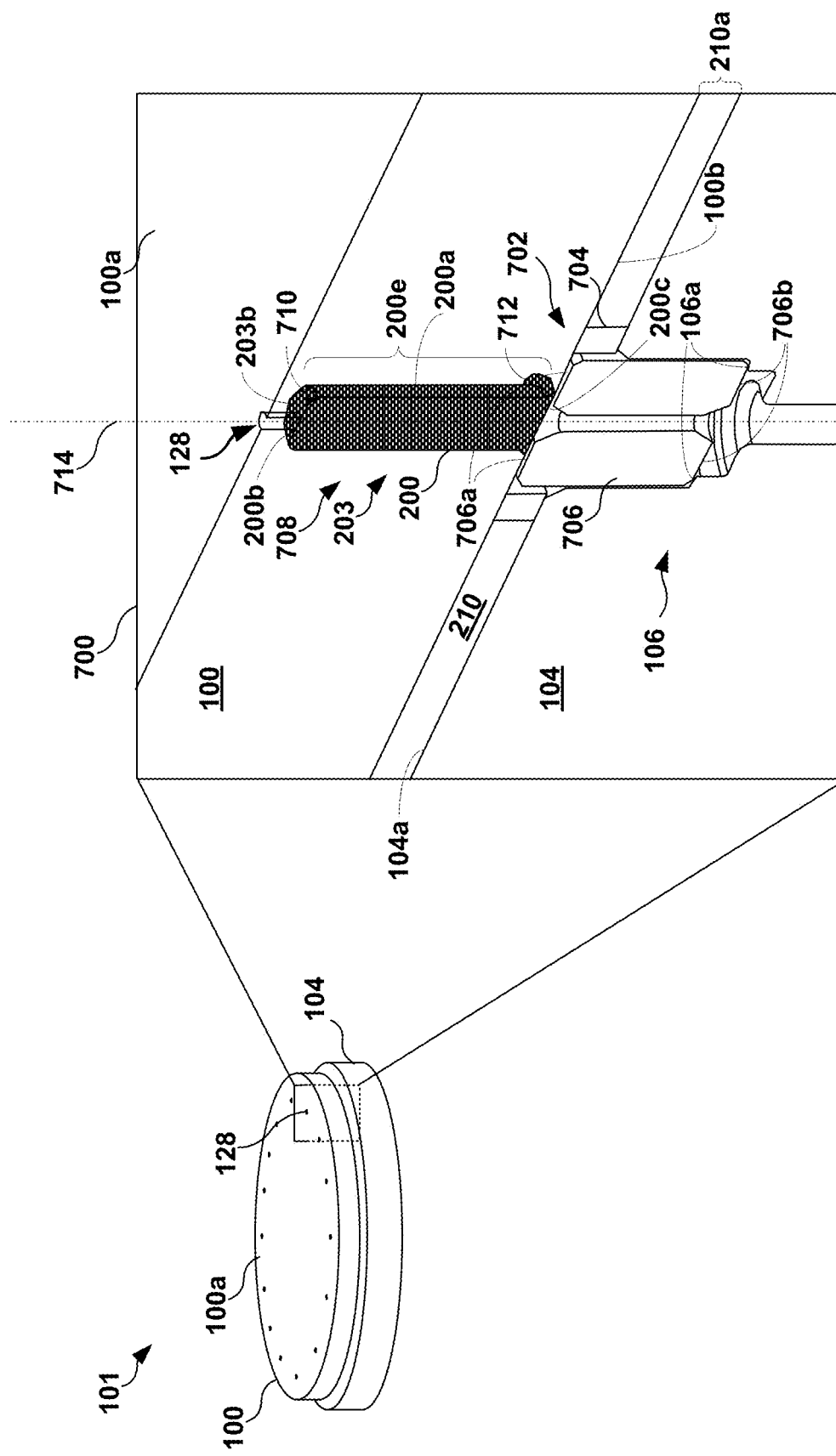
FIG. 7 shows an additional view of an ESC implementing ceramic foam plugs for gas light-up suppression, according to one embodiment.

FIG. 7 shows an additional view of an ESC 101 implementing ceramic foam plugs 200 for gas light-up suppression, according to one embodiment. An ESC 101 is shown to include at least a dielectric block 100 and a baseplate 104 with an intervening bonding layer 210. A number of gas delivery holes 128 are shown to be arranged in a circular pattern. A cut-away view 700 of one of the gas delivery holes 128 is shown as magnified. The dielectric block 100 and the baseplate 104 are bonded together with bonding layer 210. The gas delivery channel, or what is referred to a plug channel 708 in FIG. 7 for its being able to contain a ceramic foam plug 200, is shown to extend from the lower surface 100b of the dielectric block 100 to the upper surface 100a of the dielectric block 100. The ceramic foam plug 200 is shaped to fill in the space of the plug channel 708.

In the present embodiment, the shape of the foam plug 200 is quasi-cylindrical, having upper surface 200b that is curved or sloped to some degree. It may, for example, include a bevel 710 or a taper. Additionally, the foam plug 200 near the bottom surface 200c is shown to have a flange 712. The shape of the plug region 203 that contains the foam plug 200 is of a corresponding shape to substantially match that of the ceramic foam plug 200 once inserted. It is also noted that in the embodiment of FIG. 7, the lower surface 200c of the foam plug 200 is substantially flush with the lower surface 100b of the dielectric block 100.

FIG. 7 also shows a juncture 702 between the dielectric block 100 and the baseplate 104 that serves to enable flow of thermal conductance gas from the gas distribution channel 106 into the ceramic foam plug 200 in the plug channel 708. The juncture 702 is shown to have a collar 704 and sleeve 706. The collar 704 serves as a seal for the thermal conductance gas and as a barrier against the material of the bonding layer 210 such that the bonding material does not seep into and restrict the flow of gas flowing through the gas distribution channel 106 and into the plug channel 708. It is therefore contemplated that the collar 704 may contact the lower surface 100b and the upper surface 104a of the baseplate 104 to form the seal.

The sleeve 706 has a lower surface 706b that sits on a ledge 106b of the gas distribution channel 106 and extends through the upper surface 104a of the baseplate 104. In some embodiments, the sleeve 706 will have an upper surface 706a that interfaces with both the lower surface 200c of the ceramic foam plug 200 as well as the lower surface 100b of the dielectric block 100. In some embodiments, the sleeve 706 serves to define a height 210a of the bonding layer 210 when the dielectric block 100 and the baseplate 104 are pressed or mated together. Moreover, in some embodiments, the sleeve 706 serves to hold the collar 704 in place prior to and during mating of the dielectric block 100 with the baseplate 104. Further, the sleeve 706 may serve to help with alignment of the plug channel 708 and the ceramic foam plug 200 with the gas distribution channel 106 and the collar 704. Further still, the sleeve 706 may also serve to take up some volume of the gas distribution channel 106. It is contemplated that the each of the gas delivery hole 128, the ceramic foam plug 200, the plug channel 708, the collar 704, the sleeve 706 and the gas distribution channel 106 are to have a vertical (e.g., longitudinal) axis that is substantially collinear with one another and with a central axis 714 during and subsequent to mating the dielectric block 100 with the baseplate 104. In other embodiments, the sleeve 706 may also be filled with another porous plug, including alumina balls, a multilumen structure, or another ceramic foam. In other implementation, no sleeve 706 is used.

Figure 8:
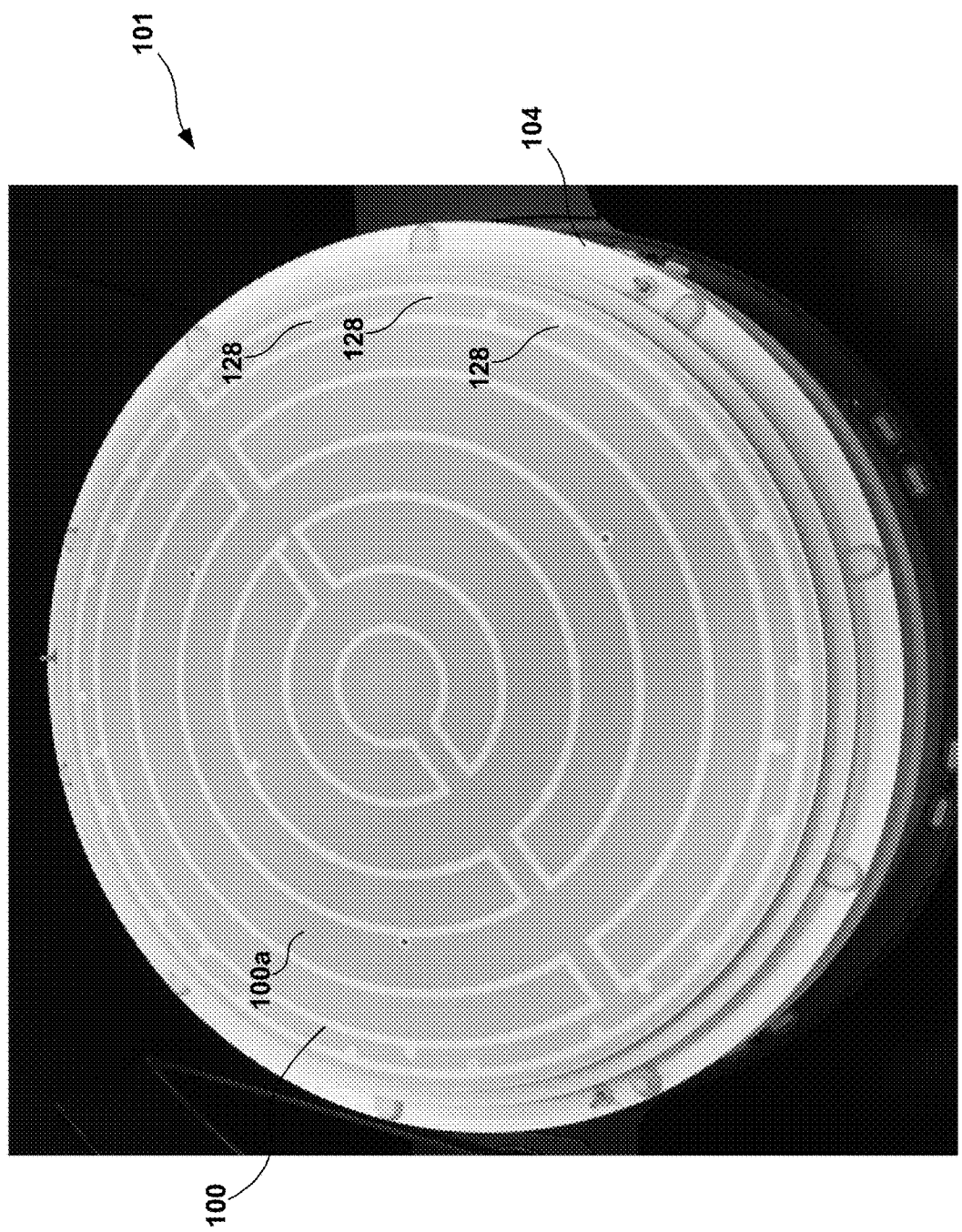
FIG. 8 is a top view of an ESC showing a circular arrangement of gas delivery holes that may be used according to some embodiments.

FIG. 8 is a top view of an ESC 101 showing a circular arrangement of 18 individual gas delivery holes 128 that may be used according to some embodiments. The gas delivery holes 128 are arranged toward an outer edge of the dielectric block 101 and are spaced from one another in a uniform manner. It will be understood that there are many other arrangements of gas delivery holes 128 that are possible and that are within the scope and spirit of what is described here. It will also be understood that differing numbers of gas delivery holes 128 may be used depending on the needs of various applications. Thus, that which is shown in FIG. 8 is intended to be illustrative and not limiting.

In other embodiments, for example, there may be concentric rings of gas delivery holes 128. In various embodiments, the gas delivery holes 128 as arranged in concentric rings may be connected via radial cuts in the rings to allow thermal conductance gas transfer between different concentric zones.

Figure 9:
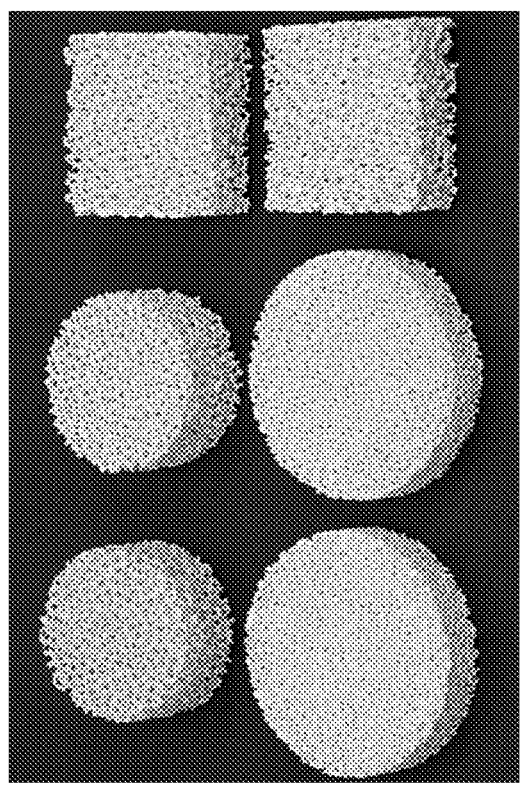
FIG. 9 shows various embodiments of ceramic foam shapes that may be implemented as ceramic foam plugs, according to certain embodiments.

FIG. 9 shows various ceramic foam shapes that may be implemented as ceramic foam plugs, according to certain embodiments. The ceramic foam shapes shown in FIG. 9 are for illustrative purposes only. The ceramic foam objects are shown to have a pre-formed pore matrix that is integrally distributed throughout the body of the shapes. The pore matrix is contemplated to have pores ranging in from 100 nanometers to 500 micrometers in average diameter for limiting the mean free path of gas flowing through the pore matrix. The pore sizes of the ceramic foam can be tightly controlled during their manufacture, and can be adjusted to fit the needs of various applications. The shape or geometry of the ceramic foam plugs can also be adapted to fit the shape or geometry of the plug channels. In some embodiments, the ceramic foam plugs may be quasi-cylindrical.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A substrate support assembly comprising:
    a dielectric block having an upper surface for interfacing with a substrate support surface and a lower surface configured for interfacing with a baseplate;
    a plurality of plug channels extending from the lower surface of the dielectric block to the upper surface of the dielectric block and through holes in the substrate support surface disposed over the upper surface of the dielectric block, wherein the plurality of plug channels is configured to introduce gas through the dielectric block to a temperature conduction region between the substrate support surface and a lower surface of a substrate when present, wherein each of the plurality of plug channels has a plug region for containing a corresponding ceramic foam plug, each ceramic foam plug having a body and a pre-formed pore matrix that is integrally distributed throughout the body;
    wherein each ceramic foam plug is secured to inner walls of a respective one of the plurality of plug channels with a bonding layer.

2. The assembly of claim 1, wherein the ceramic foam plugs are configured to suppress light-up of gas flowing through the plurality of plug channels when the assembly is subject to an electric field during a plasma processing procedure.

3. The assembly of claim 2, wherein the light-up of gas that the ceramic foam plugs are configured to suppress includes ionization of the gas, plasma formation from the gas, and discharge of electricity by arcing.

4. The assembly of claim 1, wherein the ceramic foam plugs is configured to reduce excitation of gas flowing through the plurality of plug channels by reducing a mean free path of the gas when the gas flows through the plurality of plug channels and subject to an electric field during plasma processing.

5. The assembly of claim 4, wherein the ceramic foam plugs are configured to reduce the mean free path of the gas by between a factor of 1 to a factor of 100 for a given pressure as compared to the mean free path of the gas when no ceramic foam plugs are present in the plurality of plug channels.

6. The assembly of claim 1, wherein the substrate support surface includes minimum contact area (MCA) pads for contacting the lower surface of the substrate when present, a height of the MCA pads defining a height of the temperature conduction region.

7. The assembly of claim 1, further comprising:
    the baseplate that interfaces with the lower surface of the dielectric block, the baseplate including a plurality of gas distribution channels for supplying the gas respectively to the plurality of plug channels, wherein the dielectric block is situated in relation to the baseplate such that each of the plurality of plug channels is aligned with a respective one of the plurality of gas distribution channels.

8. The assembly of claim 7, further comprising:
    a plurality of circular collars disposed between the lower surface of the dielectric block and an upper surface of the baseplate, wherein openings of the circular collar are aligned with each of the plurality of gas distribution channels and the plurality of plug channels such that there is a seal between each of the plurality gas distribution channels and the ceramic foam plug of the respective plug channel.

9. The assembly of claim 1, wherein a shape of each of the ceramic foam plugs corresponds to a shape of the plug region of the respective plug channel.

10. The assembly of claim 1, wherein the ceramic foam plugs have a porosity of between 30% to 95%.

11. The assembly of claim 1, wherein the pre-formed pore matrix has average pore sizes of between 100 nanometers to 500 micrometers in diameter.

12. A method of assembling an electrostatic chuck (ESC), comprising:
  providing a dielectric block having an upper surface for interfacing with a substrate support surface and a lower surface for interfacing with a baseplate, the dielectric block including a plurality of plug channels extending from the lower surface of the dielectric block to the upper surface of the dielectric block, each plug channel having a plug region;
  inserting a ceramic foam plug into the plug region of each plug channel, the ceramic foam plug having a body and a pre-formed pore matrix that is integrally distributed throughout the body;
  mating the lower surface of the dielectric block with an upper surface of the baseplate while the plurality of plug channels of the dielectric block is aligned with a respective plurality of gas distribution channels of the baseplate such that when gas flows out of the plurality of gas distribution channels, the gas flows into the respective ceramic foam plugs as inserted into the plurality of plug channels;
  applying, prior to said inserting, a bonding material between an inner wall of the plug region of the plug channel and an outer surface of the ceramic foam plug for securing the ceramic foam plug to the plug region of the plug channel.

13. The method of claim 12, wherein a bottom surface of the ceramic foam plug is substantially flush with the lower surface of the dielectric block.

14. The method of claim, 12, further comprising:
  applying, prior to said mating, a layer of bonding material between the lower surface of the dielectric block and the upper surface of the baseplate for securing the dielectric block to the baseplate.

15. An electrostatic chuck (ESC), comprising:
  a substrate support surface with a plurality of minimum contact area (MCA) pads for supporting a substrate;
  a dielectric block having an upper surface that interfaces with the substrate support surface and a lower surface for interfacing with a baseplate, the dielectric block includes a plurality of plug channels extending from the lower surface of the dielectric block to the upper surface of the dielectric block and through holes in the substrate support surface, wherein the plurality of plug channels is configured to introduce thermal conductance gas through the dielectric block to a temperature conduction region between the substrate support surface and a lower surface of the substrate when present;
  a plurality of ceramic foam plugs inserted into respective plug regions of the plurality of plug channels, each ceramic foam plug having a body and a pre-formed pore matrix that is integrally distributed throughout the body; and
  the baseplate including a plurality of gas distribution channels for supplying thermal conductance gas into the plurality of ceramic foam plugs, an upper surface of the baseplate interfacing with the lower surface of the dielectric block such that the plurality of gas distribution channels are aligned respectively with the plurality of ceramic foam plugs;
  wherein the ceramic foam plugs enable suppression of light-up of the thermal conductance gas when the thermal conductance gas flows through the dielectric block into the temperature conduction region when the ESC is subject to an electric field during a plasma processing procedure, the pre-formed pore matrix causing a reduction of a mean free path of the thermal conductance gas for said suppression of light-up when the thermal conductance gas is made to flow through the plurality of ceramic foam plugs.

16. The ESC of claim 15, wherein the plurality of ceramic foam plugs have a porosity of between 30% to 90% and average pore sizes of 100 nanometers to 500 micrometers in diameter.

17. The ESC of claim 15, wherein the plurality of ceramic foam plugs are configured to reduce the mean free path of the thermal conductance gas by between a factor of 1 to a factor of 100.

* * * * *